United States Patent [19]

Taylor et al.

[11] 4,152,652
[45] May 1, 1979

[54] APPARATUS FOR AND METHOD OF MEASURING RADIO FREQUENCY SIGNALS

[75] Inventors: Ray H. Taylor, Cupertino; Earnest L. Bertram, Los Altos Hills, both of Calif.

[73] Assignee: GTE Sylvania Incorporated, Mountain View, Calif.

[21] Appl. No.: 755,822

[22] Filed: Dec. 30, 1976

[51] Int. Cl.² .............................................. H04B 1/26
[52] U.S. Cl. .................................. 325/435; 325/438; 325/334; 325/363
[58] Field of Search ................. 325/363, 67, 133, 134, 325/304, 305, 368, 369, 435, 334, 335, 339, 346, 419, 433, 435, 438; 324/78 R, 78 J

[56] References Cited

U.S. PATENT DOCUMENTS

| | | | |
|---|---|---|---|
| 2,692,332 | 10/1954 | Godbey | 325/435 |
| 3,364,426 | 1/1968 | Hurvitz | 325/334 |
| 3,540,055 | 11/1970 | Takagi | 325/305 |
| 3,546,593 | 12/1970 | Gittinger | 325/435 |

Primary Examiner—Robert L. Richardson
Assistant Examiner—Tommy P. Chin
Attorney, Agent, or Firm—John F. Lawler

[57] ABSTRACT

Apparatus for detecting and measuring the values of radio frequency (RF) signals comprises two intermediate frequency (IF) channels having mixers fed by local oscillators (LO) with output frequencies having a predetermined frequency difference. The LO frequencies are selected to produce IFs from overlapping or coincident RF bands which are higher and lower, respectively, than the LO frequencies. The outputs of the mixers are measured in identical frequency discriminators, respectively, and the outputs of the discriminators are compared by logic circuits which determine the presence of signals in either or both of the channels and the value of the corresponding RF signal. This receiver eliminates the need for an RF preselector for the superheterodyne process and thereby broadens the RF bandwidth receiving capability of the system.

The invention also comprehends the method of determining the value of RF signals in a receiving system which consists of dividing the RF signal into two parts, mixing the first RF part from either first or second RF bands with a first LO frequency, mixing the second RF part with a second LO frequency to produce a second IF signal from either said second or a third RF band, measuring the values of the first and second IF signals in identical frequency discriminators, and comparing the outputs of the discriminators to determine from which of the first, second, or third RF bands the signal is derived, and measuring the RF value of the signal.

8 Claims, 8 Drawing Figures

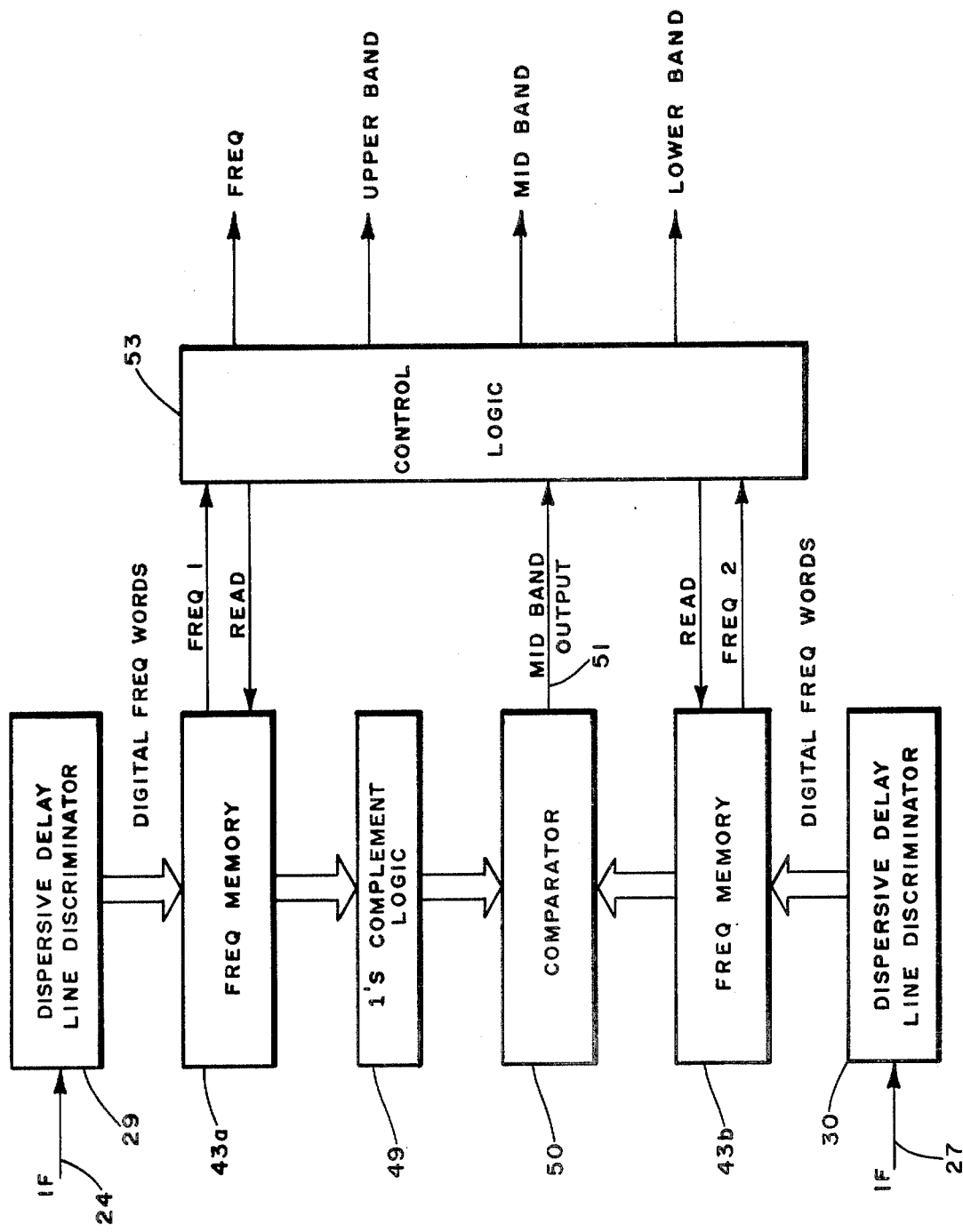
FIG. 8   RF FREQUENCY DETERMINATION LOGIC

APPARATUS FOR AND METHOD OF MEASURING RADIO FREQUENCY SIGNALS

BACKGROUND OF THE INVENTION

This invention relates to radio frequency receivers and processing techniques and more particularly to an improved superheterodyne receiver and method.

In a superheterodyne receiver, the process of mixing the output of an LO with an RF signal produces frequency components that fall within the IF band if the signal is either higher in frequency than the LO by the IF, called "top side" down conversion, or lower in frequency than the LO, called "low side" down conversion. Thus, the IF represents frequencies that are converted either from the "top side" of the LO or the "low side" of the LO.

In order to reject or suppress the image IF signal in accordance with conventional practice, an RF preselector filter or the like is used on the input side of the mixer to prevent signals from the RF band on either the high or low sides of the LO from being processed in the receiving system. While this eliminates the image IF, there is a substantial loss of the receiving bandwidth capability for the system, i.e., one-half of the potential receiving capability. In addition, the preselection filters are somewhat costly.

This invention is directed to a solution of these problems.

OBJECTS AND SUMMARY OF THE INVENTION

A general object of this invention is the provision of a superheterodyne receiving system with a bandwidth receiving capability three times greater than conventional systems utilizing RF preselectors and the like.

A further object is the provision of such a system which eliminates the use of the RF preselector resulting in substantial net reduction in cost of the system.

Still another object is the provision of a method of processing RF signals from a broad frequency band in a superheterodyne receiver that permits a determination of the value of the RF signal without using RF preselector filters or the like.

These and other objects of the invention are achieved by using a receiver with two IF channels having LO frequencies separated by a predetermined frequency difference such that the "top side" RF band of the mixer in one channel is coincident with the "low side" RF band of the mixer in the other channel. Both mixer outputs are measured by identical IF signal measuring means, respectively, and are compared with each other to identify which of the three bands ("low side" of the mixer, "top side" of the other mixer, or the coincident bands of both mixers) the measured signal falls to identify the value of the RF signal received.

BRIEF DESCRIPTION OF THE DRAWINGS

FIG. 8 is a functional block diagram illustrating the comparison and control logic of the processor used in the practice of the invention.

DESCRIPTION OF THE PREFERRED EMBODIMENT

Figure 1:
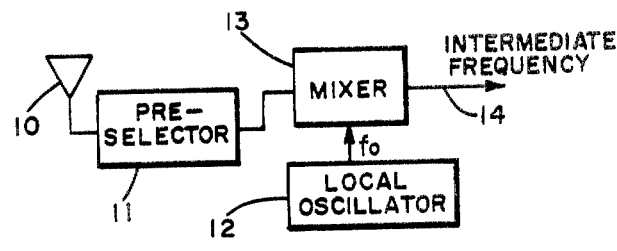
FIG. 1 is a block diagram of the front part of a superheterodyne receiving system of the prior art.
Figure 2:
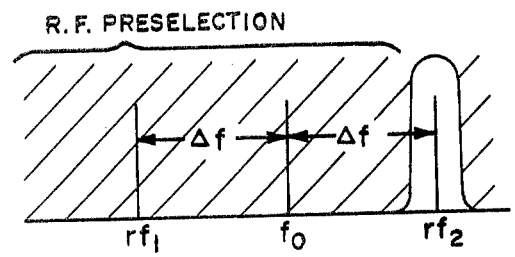
FIG. 2 is a frequency diagram illustrating the bandwidth limiting effect of RF preselection.

Referring now to the drawings, FIG. 1 illustrates an antenna 10 which is connected to the front end of a conventional superheterodyne receiver comprising an RF preselector 11, a local oscillator 12 having a frequency $f_0$, and a mixer 13 which receives the outputs of preselector 11 and local oscillator 12 for producing an IF output 14 constituting the difference between the LO frequency $F_0$ and that of the RF signal. Preselector 11 passes only signals in a band on one side the local oscillator frequency $f_0$, the "high side" as shown in FIG. 2, the pass band being indicated in the non-shaded area. Thus if two incoming signals $rf_1$ and $rf_2$ that have the same frequency spacing $\Delta f$ from the LO frequency $f_0$, $rf_1$ is filtered out and only $rf_2$ is applied to mixer 13 to produce an IF signal at mixer output 14. The bandwidth of this receiver is thus automatically reduced in order to produce an IF output that corresponds to but one RF input signal.

Figure 3:
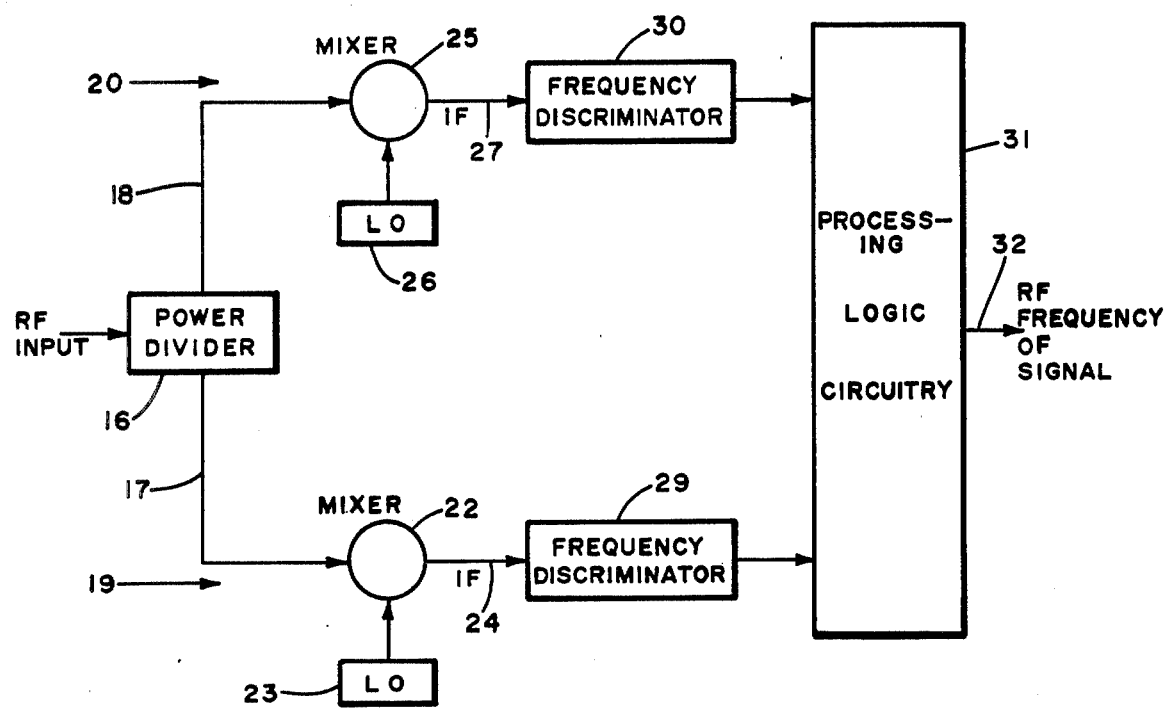
FIG. 3 is a block diagram of a superheterodyne receiving system embodying this invention.

In accordance with this invention, the RF input from an antenna or the like is applied to a power divider 16, see FIG. 3, which has outputs on lines 17 and 18 connected to two separate processing channels 19 and 20, respectively. Channel 19 comprises mixer 22 which combines the output from LO 23 with the RF signal on line 17 to produce an IF signal on line 24. Similarly, channel 20 comprises a mixer 25 which mixes the outputs of LO 26 and the RF signal on line 18 to produce another IF signal on line 27.

In order to measure the values of the IF signals in both channels and to convert them to a form that may be readily processed, lines 24 and 27 are connected to frequency discriminators 29 and 30, respectively. These discriminators are substantially identical to each other and are connected to processing logic 31 to derive the value of the input RF signal on output line 32.

Figure 4:
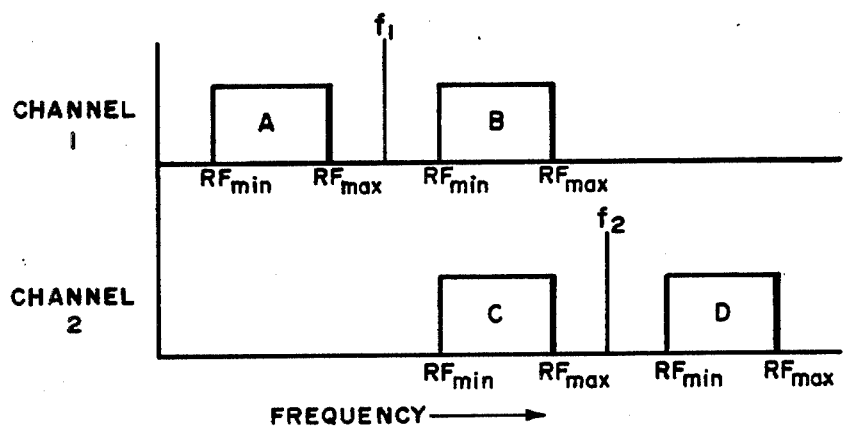
FIGS. 4 and 5 are frequency diagrams illustrating the principle of operation of the receiving system embodying the invention.
Figure 5:
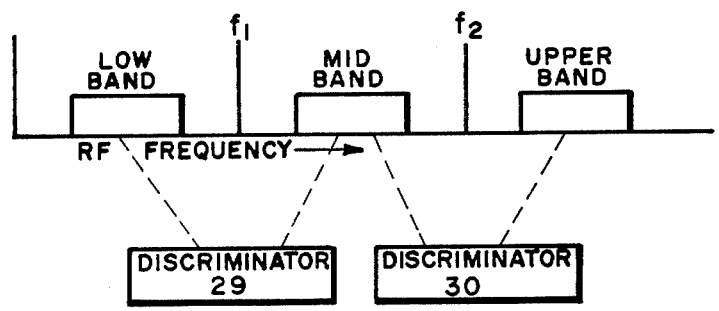

In accordance with this invention, the frequencies of oscillators 23 and 26 are different, the values being such that the RF band on the high side of the lesser LO frequency overlaps or is coincidental with the RF band on the low side of the greater LO frequency. This is illustrated more clearly in FIG. 4 wherein the output of oscillator 23 in channel 19 appears as $f_1$ on the frequency scale and the RF bands which produce the intermediate frequencies in channel 19 are indicated at A on the "low side" and at B on the "top side". Similarly, in channel 20 the output of oscillator 26 appears as $f_2$ on the frequency scale and RF bands C and D which produce the intermediate frequency signal are located on the "low side" and "top side", respectively, of this frequency. The values selected for $f_1$ and $f_2$, in accordance with this invention, are such as to provide an overlap or coincidence of "top side" band B and "low side" band C. Stated differently, the difference between $f_1$ and $f_2$ is equal to substantially twice the IF for an RF signal located at the middle of one of the RF bands A or B. The result is that IF signals are produced by this circuit from three separate RF bands indicated in FIG. 5 as the low band, mid band, and upper band, and the two IF bands of channels 19 and 20, indicated as discriminators 29 and 30 derive signals from the low and upper bands, respectively, and the mid band.

The frequencies of the RF input signals are measured in either or both of channels 19 and 20. If the RF signal is in the low band only, i.e., band A in FIG. 4, the measured value of the IF signal in channel 19 provides a direct measure of the unknown RF. Similarly, RF signals in the high band only (band D) are measured directly from the IF channel in channel 20. If the RF signal appears in the mid band, i.e., both bands B and C, however, then its frequency is measured in both channels simultaneously by discriminators 29 and 30. There is an exact mathematical relationship between these to simultaneous frequency readings as expressed in the following equation:

$$f_2 = f_{max} - (f_1 - f_{min}) = f_{min} + f_{max} - f_1 \quad (1)$$

where $f_1$ is the frequency reading of discriminator 29, $f_2$ is the reading of discriminator 30, $f_{min}$ is the minimum frequency reading of either discriminator, and $f_{max}$ is the maximum reading of either discriminator. It will be noted that the discriminators 29 and 30 are substantially identical and therefore $f_{min}$ and $f_{max}$ will be the same for both discriminators.

Because of the relationship set forth in equation (1), it is possible to examine simultaneously the outputs of the two discriminators to determine if the same signal is present in both discriminators. This information together with the fact that an output from only one discriminator automatically identifies the originating RF band makes it possible to unambiguously determine where the signal is in the RF spectrum, and more particularly in which of the three RF bands it lies.

The signal processing logic is used to determine the RF frequency of the signal is restated in an algorithm as follows:

1. The signal is in the upper RF band if a signal is in the output of discriminator 30 but no signal is found in discriminator 29.
2. The signal is in the low RF band if a signal is in the output of discriminator 29 but no signal is found in discriminator 30.
3. The signal is in the mid RF band if a signal is present in both discriminators 29 and 30 and the signal follows the frequency relationship of equation (1) above.

The algorithm is solved in processing logic 31, which is described in more detail below, to produce the value of the RF signal at its output 32.

Figure 6:
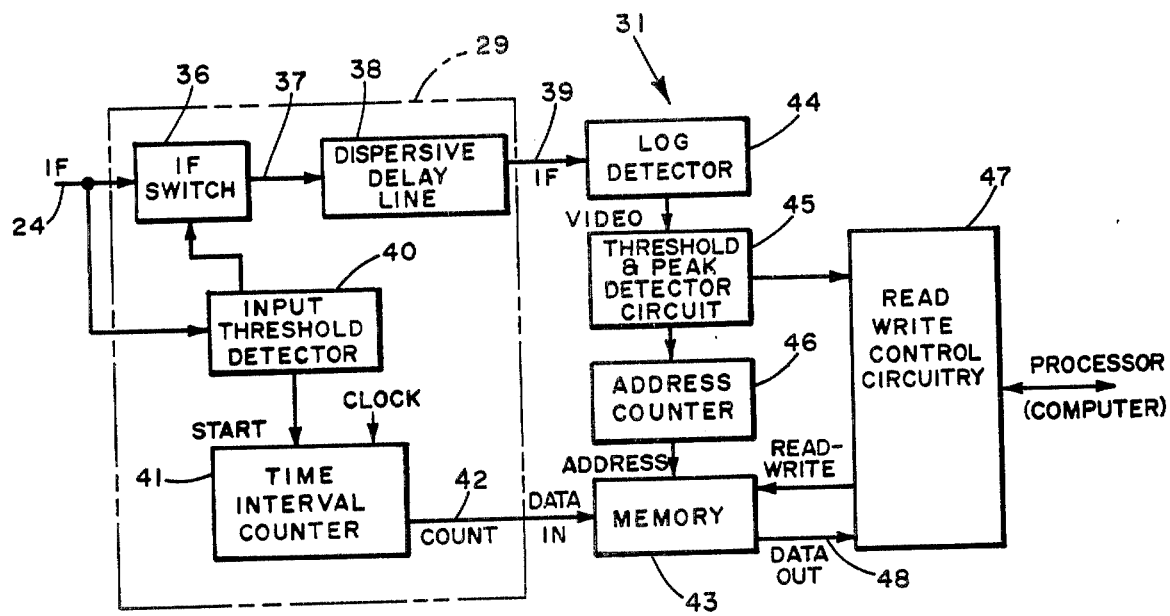
FIG. 6 is a block diagram of the frequency discriminator and logic circuitry used for each of the IF channels in the system.
Figure 7:
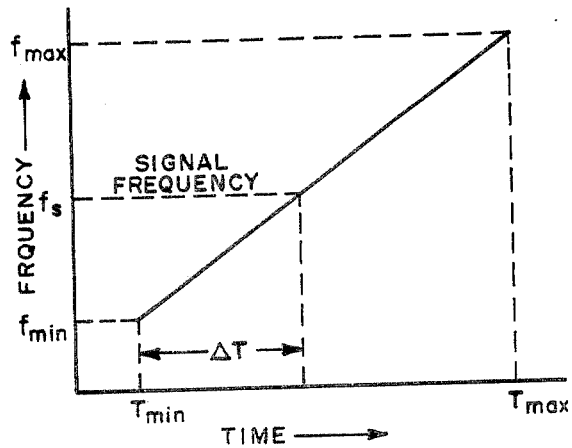
FIG. 7 is a typical time-frequency response of the dispersive delay line forming part of the discriminator shown in FIG. 6.

Since discriminators 29 and 30 are identical, a description of one of them will be sufficient. Discriminator 29 comprises an IF switch 36, see FIG. 6, having an input connected to line 24 from mixer 22 and an output line 37 connected directly to dispersive delay line 38 which produces an IF output on line 39 which has been delayed for an interval of time directly proportional to the value of the IF. The time-frequency characteristic of this delay line is shown in FIG. 7 wherein a given signal frequency $f_s$ is shown as producing a time delay of $\Delta T$. The dispersive delay line is well known in the art and does not per se constitute part of the invention.

The IF input 24 is applied to the input threshold detector 40 which produces an output when the IF signal level exceeds a predetermined level. This output turns IF switch 24 on for a short predetermined length of time to allow an amplitude-shaped sample pulse of the input to propagate through the delay line. This output also starts a time interval counter 41. The output of counter 41 on line 42 is directly proportional to the time which has lapsed since the IF signal entered delay line 38. Since this time interval is directly proportional to frequency, the count is a measure of the IF. A continuous succession of IF signals is accommodated by counter 41 by reason of connection of its output on line 42 to a memory bank 43 forming part of the processing logic 31. Memory bank 43, for example, may have an 8-bit 16-word capacity.

The IF output from delay line 38 on line 39 is applied to a log detector 44 for conversion to a video signal which passes through a threshold and peak detector circuit 45 to an address counter 46. Counter 46 operates in conjunction with time interval counter 41 to load memory bank 43 successively with time counts corresponding to IF signals being processed so that the memory stores a plurality of successive signals successively in different memory slots.

In order to access memory bank 43, read-write control circuitry 47 is operationally connected to memory bank 43 and to threshold circuit 45. This permits the count in memory bank 43 to be read out on line 48 for the corresponding IF signal for conversion in a processor, not shown, to the corresponding RF value of that IF signal.

The function of the processing logic circuitry 31 in determining the RF values of signals is better understood by reference to FIG. 8. The IF outputs from discriminators 29 and 30 are loaded into memory banks 43a and 43b, respectively, and the output of memory 43a is complemented by a 1's complement logic circuit 49 which converts the stored IF value to a value useful for direct comparison with IF values stored in memory bank 43b. For example, the complement of the signal $f_s$ in FIG. 7 is $(f_{max} - f_s)$. The output of logic circuit 49 is then compared with IF values in memory bank 43b in a comparator 50 to determine if signals exist in both memory banks. If there is such a match, an output appears on line 51 indicating that the signal being processed is from the mid band. This logic circuitry cycles through all permutations of frequencies recorded at one sample of the RF spectrum and determines from which RF band that sample is derived. The operation is controlled by control logic circuitry 53 which passes the derived data to a processor, such as computer, for derivation of the frequency value of the RF signal in a manner well known in the art. Alternatively, control circuitry 53 may comprise part of a computer.

The steps in the frequency determining sequence are restated as follows:

1. Get the first frequency from memory 43a.
2. Complement the frequency.
3. Cycle through all frequencies in memory 43b looking for a match, within limits.
4. If a match is found, then the frequency reading of discriminator 29 belongs to the mid band RF frequency and that frequency is added to the beginning frequency of the mid band range to get the correct RF. This frequency is then removed from memory 43b.
5. If no match is found, then frequency of discriminator 29 belongs to the low RF band and that frequency is added to the beginning frequency of the low band RF to determine its value.
6. Steps 1 - 4 are repeated until memory 43a is empty.
7. All frequencies left in memory 43b belong to the upper RF band, and these frequencies are added to the beginning frequency of the upper RF band to get the correct RF value.

The foregoing system and method eliminates the need for an RF preselection filter and thus provides a significant cost savings over the conventional superheterodyne processing technique. In addition, the RF bandwidth represented by the discriminator output is three times that of the conventional receiver. Furthermore, the invention readily accommodates simultaneously occurring signals which condition is more likely to occur due to the broadened bandwidth capability of the system.

What is claimed is:

1. A radio frequency receiving system comprising means for receiving radio frequency (RF) signals,
   a power divider having an input connected to said receiving means and having pair of outputs,
   first and second signal processing channels connected to said power divider outputs, respectively, said channels comprising
   first and second local oscillators (LO), respectively, producing first and second LO frequencies, respectively,
   means in said channels for mixing the RF outputs from the power divider with said first and second LO frequencies, whereby to produce intermediate frequency (IF) signals, said IF signal from the mixing means in the first channel being derived from RF signals in first and second frequency bands respectively lower and higher than said first LO frequency and said IF signals from the mixing means in the second channel being derived from RF signals in third and fourth frequency bands respectively lower and higher than said second LO frequency,
   said first and second LO frequencies being different and having values selected to cause coincidence of said second and third RF bands, and
   means responsive to the outputs of said mixing means for comparing the IF signals in said first and second channels and producing an output indicative of the value of the received RF signal.

2. The system according to claim 1 with identical measuring means connected to the outputs of said mixing means, respectively, for producing outputs corresponding to the values of the IF signals in said channels, said outputs of said measuring means being connected to said comparing means.

3. The system according to claim 2 in which said comparing means comprises logic means conditioned to identify the value of the RF signal corresponding to the IF signal in accordance with an output exclusively from either of said channels and in accordance with an output from both of said channels based on the relationship $$f_2 = f_{min} + f_{max} - f_1$$

where $f_1$ and $f_2$ are the IF outputs of said measuring means in the first and second channels, respectively, and $f_{min}$ and $f_{max}$ are the minimum and maximum IF measuring limits, respectively, of said measuring means.

4. The system according to claim 3 in which said measuring means in each of said channels comprises a dispersive delay line.

5. The system according to claim 1 in which the difference between the first and second LO frequencies is substantially twice the value of the IF signal corresponding to the RF signal at the middle of one of said bands.

6. In a receiving system adapted to receive radio frequency (RF) signals in three successively adjacent RF bands, the method of determining the value of an RF signal in said bands consisting of the steps of
   separating said RF signal into two parts,
   applying one of said RF signal parts to a mixer fed by the output of a first local oscillator (LO) having a frequency midway between the first and second of said three RF bands for producing the first intermediate frequency (IF),
   applying the other of said RF signal parts to another mixer fed by the outputs of a second LO having a frequency midway between the second and third of said RF bands for producing a second IF,
   applying the outputs of said mixers to identical frequency discriminators, respectively, for measuring the value of the IF signals, and
   comparing the outputs of said discriminators and determining the RF band from which the measured IF is derived whereby to indicate the value of the RF signal.

7. In a receiving system adapted to receive radio frequency (RF) signals, the method of identifying the frequency of a received RF signal within a predetermined band of frequencies consisting of the steps of
   mixing the RF signal with the outputs of first and second local oscillators (LOs), respectively, having frequencies separated by twice the intermediate frequency (IF) of an RF signal at the middle of said band and producing mixer outputs,
   measuring the IF signal in at least one of the mixer outputs,
   determining whether said measured IF signal is in said predetermined band, and, if so,
   converting said IF to the corresponding RF value.

8. The method according to claim 7 with the steps of measuring the IF signal in both of said mixer outputs with identical frequency discriminators and
   comparing the measured IF values from said discriminators to determine the RF band from which the IF is derived.

* * * * *